United States Patent
Gilbert et al.

(10) Patent No.: US 10,312,436 B2
(45) Date of Patent: Jun. 4, 2019

(54) GROUND STATE ARTIFICIAL SKYRMION LATTICES AT ROOM TEMPERATURE

(71) Applicant: THE REGENTS OF THE UNIVERSITY OF CALIFORNIA, Oakland, CA (US)

(72) Inventors: Dustin Gilbert, Davis, CA (US); Kai Liu, Davis, CA (US)

(73) Assignee: THE REGENTS OF THE UNIVERSITY OF CALIFORNIA, Oakland ( * ) Notice: Subject to any disclaimer, the term of this patent is extended or adjusted under 35 U.S.C. 154(b) by 0 days.

(21) Appl. No.: 15/880,916

(22) Filed: Jan. 26, 2018

(65) Prior Publication Data
US 2018/0240972 A1  Aug. 23, 2018

Related U.S. Application Data

(63) Continuation of application No. PCT/US2016/045851, filed on Aug. 5, 2016.
(Continued)

(51) Int. Cl.
*H01L 43/12* (2006.01)
*H01L 43/10* (2006.01)
(Continued)

(52) U.S. Cl.
CPC ............. *H01L 43/12* (2013.01); *B82Y 25/00* (2013.01); *H01F 10/3286* (2013.01);
(Continued)

(58) Field of Classification Search
None
See application file for complete search history.

(56) References Cited

U.S. PATENT DOCUMENTS

| | | | |
|---|---|---|---|
| 2005/0068688 A1* | 3/2005 | Sbiaa | B82Y 10/00 360/324.1 |
| 2015/0146469 A1 | 5/2015 | Moutafis | |

(Continued)

FOREIGN PATENT DOCUMENTS

| | | |
|---|---|---|
| JP | 2014086470 A | 5/2014 |
| JP | 2014175417 A | 9/2014 |

OTHER PUBLICATIONS

Korean Intellectual Property Office (KIPO), International Search Report and Written Opinion dated Nov. 16, 2016, related PCT international application No. PCT/US2016/045851, pp. 1-11, with claims searched, pp. 12-16.

(Continued)

*Primary Examiner* — Reema Patel
*Assistant Examiner* — Steven M Christopher
(74) *Attorney, Agent, or Firm* — O'Banion & Ritchey LLP; John P. O'Banion

(57) ABSTRACT

A method for fabricating artificial skyrmions and skyrmion lattices with a stable ground state at room temperature and in the absence of magnetic fields is provided. The lattices are formed by patterning vortex-state nanodots over macroscopic areas on top of an underlayer with perpendicular magnetic anisotropy (PMA); and preparing artificial skyrmion lattices using ion irradiation to suppress PMA in the underlayer and allow imprinting of the vortex structure from the nanodots to form the skyrmion lattices. Alternatively the skyrmions can be formed by ion-irradiating select asymmetric nanodot regions of the PMA underlayer, leading to planar skyrmions without nanodot protrusions. These artificial skyrmions can be used for low dissipation information storage, such as magnetic memory, logic devices and sensors.

24 Claims, 5 Drawing Sheets

Related U.S. Application Data

(60) Provisional application No. 62/201,192, filed on Aug. 5, 2015.

(51) Int. Cl.
   *H01F 10/32* (2006.01)
   *H01F 41/14* (2006.01)
   *H01L 43/08* (2006.01)
   *B82Y 25/00* (2011.01)

(52) U.S. Cl.
   CPC ............. *H01F 41/14* (2013.01); *H01L 43/08* (2013.01); *H01L 43/10* (2013.01)

(56) References Cited

U.S. PATENT DOCUMENTS

| | | | |
|---|---|---|---|
| 2016/0223413 A1* | 8/2016 | Kubota | G01L 1/2206 |
| 2017/0053686 A1* | 2/2017 | Oike | G11C 11/16 |
| 2017/0179375 A1* | 6/2017 | Nagaosa | H01L 43/08 |

OTHER PUBLICATIONS

Mao, B. F. et al., "Experimental realization of two-dimensional artificial skyrmion crystals at room temperature", Physical Review B, vol. 90, Issue 17, p. 174411, 6 pages, Nov. 11, 2014.

Chen, Gong et al., "Tailoring the chirality of magnetic domain walls by interface engineering", Nature Communications, 4:2671, 7 pages, Oct. 24, 2013.

Bhattacharya, Dhritiman et al., "Voltage controlled core reversal of fixed magnetic skyrmions without a magnetic field", Scientific Reports vol. 6, Article No. 31272 (2016), published online Aug. 10, 2016.

Fert, Albert et al., "Skyrmions on the track", Nature Nanotechnology, vol. 8, Mar. 2013, p. 152-156.

Gilbert, Dustin A. et al., "Realization of ground-state artificial skyrmion lattices at room temperature", Nature Communications, 6:8462, DOI:10.1038/ncomms9462, pp. 1-7, published Oct. 8, 2015.

Huang, S. X. et al., "Extended Skyrmion Phase in Epitaxial FeGe (111) Thin Films", Physical Review Letters, PRL 108, 267201-1 to 267201-5 (2012), week ending Jun. 29, 2012.

Jiang, Wanjun et al., "Direct Observation of the Skyrmion Hall Effect", Nature Physics 13, 162 (2017), arXiv:1603.07393, published online Sep. 19, 2016.

Jiang, Wanjun et al., "Blowing magnetic skyrmion bubbles", Science, vol. 349, issue 6245, pp. 283-286, Jul. 17, 2015, published online Jun. 11, 2015.

Jonietz, F. et al., "Spin Transfer Torques in MnSi at Ultralow Current Densities", Science, vol. 330, pp. 1648-1651, Dec. 17, 2010.

Li, J. et al., "Tailoring the topology of an artificial magnetic skyrmion", Nature Communications, 5:4704, DOI:10-1038/ncomms5704, ppl 1-6, published Aug. 19, 2014.

Muhlbauer, S. et al., "Skyrmion Lattice in a Chiral Magnet", Science, vol. 323, pp. 915-919, Feb. 13, 2009.

Miao, B. F. et al., "Micromagnetic study of excitation mode of an artificial skyrmion crystal", Applied Physics Letters 107, 222402-1 to 222402-5 (2015).

Miao, B. F. et al., "Experimental realization of two-dimensional artificial skyrmion crystals at room temperature", Physical Review B 90, 174411-1 to 174411-5 (2014).

Moreau-Luchaire, C. et al., "Additive interfacial chiral interaction in multilayers for stabilization of small individual skyrmions at room temperature", Nature Nanotechnology, vol. 11, May 2016, DOI: 10.1038/nnano.2015.313, pp. 444-450, published online Jan. 18, 2016.

Nagaosa, Naoto et al., "Topological properties and dynamics of magnetic skyrmions", Nature Nanotechnology, vol. 8, Dec. 2013, DOI: 10.1038/nnano2013.243, pp. 899-911, published online Dec. 4, 2013.

Rossler, U. K. et al., "Spontaneous skyrmion ground states in magnetic metals", Nature Letters, vol. 442, doi:10.1038/nature05056, Aug. 17, 2016, pp. 797-801.

Sapozhnikov, M. V. et al., "Artificial dense lattice of magnetic bubbles", Applied Physics Letters 109, 042406-1 to 042406-5 (2016).

Sun, L. et al., "Creating an Artificial Two-Dimensional Skyrmion Crystal by Nanopatterning", Physical Review Letters, PRL 110, 167201-1 to 167201-5, week ending Apr. 19, 2013.

Tan, A. et al., "Topology of spin meron pairs in coupled Ni/Fe/Co/Cu (001) disks", Physical Review B 94, 014433-1 to 014433-8 (2016).

Woo, Seonghoon et al., "Observation of room-temperature magnetic skyrmions and their current-driven dynamics in ultrathin metallic ferromagnets", Nature Materials Letters, DOI: 10.1038/nmat4583, pp. 1-7, published online Feb. 29, 2016.

* cited by examiner

GROUND STATE ARTIFICIAL SKYRMION LATTICES AT ROOM TEMPERATURE

CROSS-REFERENCE TO RELATED APPLICATIONS

This application is a 35 U.S.C. § 111(a) continuation of PCT international application number PCT/US2016/045851 filed on Aug. 5, 2016, incorporated herein by reference in its entirety, which claims priority to, and the benefit of, U.S. provisional patent application Ser. No. 62/201,192 filed on Aug. 5, 2015, incorporated herein by reference in its entirety. Priority is claimed to each of the foregoing applications.

The above-referenced PCT international application was published as PCT International Publication No. WO 2017/024253 on Feb. 9, 2017, which publication is incorporated herein by reference in its entirety.

STATEMENT REGARDING FEDERALLY SPONSORED RESEARCH OR DEVELOPMENT

This invention was made with Government support under DMR1008791, ECCS1232275 and DMR1543582, awarded by the National Science Foundation. The Government has certain rights in the invention.

INCORPORATION-BY-REFERENCE OF COMPUTER PROGRAM APPENDIX

Not Applicable

BACKGROUND

1. Technical Field

The present technology pertains generally to magnetic information storage devices and manufacturing methods, and more particularly to fabrication methods for artificial skyrmions and skyrmion lattices with a stable ground state at ambient temperatures that operate in the absence of magnetic fields.

2. Background Discussion

The recent discovery of magnetic skyrmions has sparked intense interest in condensed matter physics and materials science. Magnetic skyrmions are chiral spin textures with topological character and particle-like properties, primarily observed in ferromagnetic thin films or non-centrosymmetric bulk materials. The unique spin texture in magnetic skyrmions leads to a host of fascinating phenomena due to the topologically protected quantum state and emergent electromagnetic field, offering great potential for novel concepts in low dissipation magnetic information storage, or skyrmionics. To date, the majority of the magnetic skyrmion phases have been limited to low temperatures and finite magnetic fields. However, for systematic studies of the unique properties and the technological exploitation of magnetic skyrmions it is critical to achieve them in the ground state at ambient conditions.

The Dzyaloshinskii-Moriya interaction is a common mechanism for generating magnetic skyrmions in certain non-centrosymmetric magnets such as MnSi(Fe,Co), (Mn, Fe)Ge, $Cu_2OSeO_3$, and $La_2Cu_{0.97}Li_{0.03}O_4$, which are usually limited to low temperatures and in finite magnetic fields. Artificial structures such as thin films have been shown to extend the skyrmion phase space. Frustrated exchange interactions and four-spin exchange interactions have also been shown to lead to atomic-sized skyrmions at low temperatures. However, in order to commercially exploit and systematically study magnetic skyrmions, it is necessary to reliably produce skyrmions with a ground state at ambient conditions rather than low temperatures.

In systems with perpendicular magnetic anisotropy (PMA), the competition between PMA and dipolar interactions may result in the formation of magnetic bubbles, some of which are actually magnetic skyrmions with topological characteristics. In conjunction with interfacial Dzyaloshinskii-Moriya interactions, breaking the mirror symmetry, such PMA systems show potential for room temperature control of skyrmions. At the present time, direct evidence of skyrmions in these bubbles is still lacking. Furthermore, as the formation and stabilization of bubbles in PMA systems generally require the application of an external magnetic field, the claimed skyrmion state is not the ground state in a zero field.

In short, magnetic skyrmions have so far been experimentally demonstrated only in bulk materials and in epitaxial ultrathin films, and under an external magnetic field or at substantially low temperatures.

Therefore, there remains an urgent need to achieve magnetic skyrmions that are stable at room temperature, and in the absence of a magnetic field. The present technology satisfies these needs and is generally an improvement in the art.

BRIEF SUMMARY

The unique spin texture in magnetic skyrmions leads to a number of fascinating phenomena due to the topologically protected quantum state and emergent electromagnetic field, offering great potential for novel device structures with low dissipation magnetic information storage, or skyrmionics. However, the development of systems exhibiting the skyrmion phase at ambient conditions has been elusive. To date, the vast majority of the magnetic skyrmion phases have been limited to low temperatures and finite magnetic fields.

The present technology provides methods for fabricating artificial skyrmions and skyrmion lattice over extended areas that have a stable ground state and which establishes itself at ambient conditions. The methods generally involve patterning "vortex-state" asymmetric magnetic nanodots with controlled circularity over macroscopic areas (on the order of 1 $cm^2$) on top of an underlayer with perpendicular magnetic anisotropy (PMA), and then prepare the skyrmion state using a specific magnetic field sequence. Circularity control in the nanodots is realized through shape asymmetry. Polarity is controlled by a tailored magnetic field sequence and can be demonstrated in magnetometry measurements. In particular, ion irradiation is employed to suppress PMA in the underlayer and allow imprinting of the vortex structure from the nanodots to form skyrmions, which is an important step. This step leads to skyrmions at the interfacial region of the underlayer. The imprinted skyrmions can be identified directly with polarized neutron reflectometry and confirmed by magnetoresistance measurements.

By way of example, and not of limitation, the technology can be illustrated with an architecture that has a base silicon substrate and an active PMA layer of multiple alternating layers of metals such as Co/Pd layers. A preferred approach is to pattern vortex-state nanodots (560 nm diameter) in hexagonal arrays via electron-beam lithography on top of a Co/Pd multilayer with perpendicular magnetic anisotropy. Then artificial skyrmion lattices are prepared using ion irradiation to suppress PMA in the underlayer and allow imprinting of the vortex structure from the nanodots to form the skyrmion lattices. The skyrmion state may be produced by saturating the under layer in the positive out-of-plane (+OOP) direction, then applying a small negative out-of-plane (−OOP) field. Then an in-plane (IP) field is applied parallel to the asymmetric edge. As the fields are removed the dots will nucleate a magnetic vortex with a controlled circularity and a core in the −OOP direction, which are imprinted into the underlayer. The resultant artificial skyrmion lattices exhibit circularity and polarity control over the entire lattice.

Circularity control in the Co nanodots is realized through shape asymmetry, and can be confirmed by magnetic imaging, such as magnetic force microscopy and scanning electron microscopy with polarization analysis. The vortex polarity is typically set by an external magnetic field to be opposite of the underlying Co/Pd film, and confirmed by magnetometry measurements. The vortex structure of the Co nanodots is imprinted into the Co/Pd. The imprinted spin structure is shown to only extend as deep as the irradiation damage. In one embodiment, the materials and dimensions of the PMA underlayer and the in-plane magnetic dots are suitably chosen so as to have perpendicular magnetization in the underlayer, in-plane vortex state in the dots, and sufficiently separated coercivities in these two components.

Only properly irradiated samples demonstrate skyrmion lattices at the interfacial region of the underlayer with imprinted spin textures embedded in an unirradiated PMA matrix. In the control experiments, the samples without proper ion irradiation may produce vortex lattices which have physical characteristics similar to skyrmions but they lack key properties that ensure topological protection.

Accordingly, the methods involve proper choices of materials, structures, and surface modification via ion irradiation, as well as a suitable magnetic field sequence to achieve stable artificial magnetic skyrmions and skyrmion lattices at room temperature and in the absence of any magnetic field. The present technology provides a convenient and powerful platform to explore skyrmion physics and topological phenomena. The technology also includes device concepts that utilize such artificial skyrmions in low dissipation information storage and magnetic sensing applications.

In addition, the methods can be used to produce alternative structures such as unpinned "dotless" skyrmions that are mobile and driven by current. Skyrmion "race-tracks" have also been designed to investigate pumping and manipulation of such mobile skyrmions.

According to one aspect of the technology, a method for fabricating artificial skyrmion lattices with a stable ground state at room temperature is provided that incorporates patterning of vortex-state nanodots over macroscopic areas on the top of an underlayer that has perpendicular magnetic anisotropy (PMA); and preparing artificial skyrmion lattices using ion irradiation to suppress PMA in the underlayer and allow imprinting of the vortex structure from the nanodots to form the skyrmion lattices.

Another aspect of the technology is to provide magnetic skyrmion lattice structures with stable ground states at ambient temperatures and in the absence of magnetic fields, which may be integrated into a wide variety of devices.

Another aspect of the technology is to provide a method for fabricating magnetic skyrmion lattice structures with features that have tunable circularity, polarity, and magnetization characteristics and performance.

Another aspect of the technology is to provide magnetic skyrmion lattice structures for devices such as low dissipation skyrmion-based non-volatile magnetic memory, logic devices and sensors.

A further aspect of the technology is to provide a production system that uses fabrication methods that are easy to implement in high-volume manufacturing facilities for high volume production.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Referring more specifically to the drawings, for illustrative purposes, embodiments of the methods and resulting structures are generally shown. Several embodiments of the technology are described generally in FIG. 1 through FIG. 8 to illustrate the system, devices and methods. It will be appreciated that the methods may vary as to the specific steps and sequence and the system and devices may vary as to structural details without departing from the basic concepts as disclosed herein. The method steps are merely exemplary of the order that these steps may occur. The steps may occur in any order that is desired, such that it still performs the goals of the claimed technology.

Figure 1:
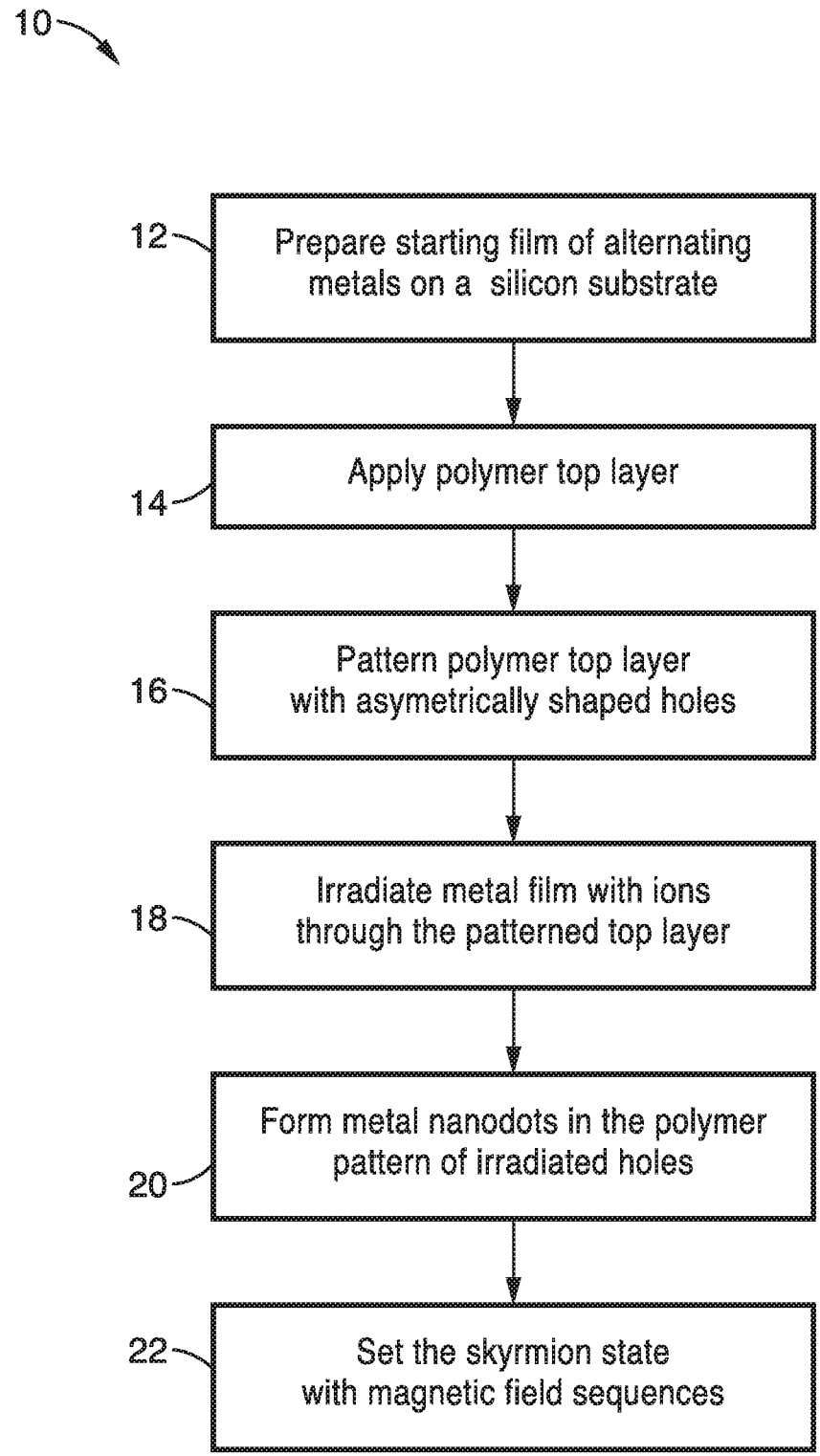
FIG. 1 is a schematic flow diagram of a method of fabrication of skyrmion lattices according to one embodiment of the technology.

Turning now to FIG. 1, one preferred embodiment 10 of a method for fabricating an artificial skyrmion lattice according to the technology is generally shown to illustrate one suitable structure and fabrication method. The intermediate structures produced by the steps of the illustrated fabrication method are depicted schematically in FIG. 2 through FIG. 6 for the formation of a single skyrmion within a lattice. However, it can be seen that the structural and functional features of the skyrmion lattice designs can be controlled through the selection of method steps and materials.

In the embodiment 10 shown in FIG. 1, the general procedure sees circularity controlled vortex-state microdots or nanodots patterned on an underlayer with perpendicular anisotropy. Relying on the exchange interaction, the chiral structure from the dot is imprinted into the underlayer.

At block 12 of FIG. 1, an initial structure of a multilayer film of metals on a silicon substrate is constructed. The layer of alternating metals may be composed of several layers of alternating pairs of metal layers. In the embodiment illustrated in FIG. 2 through FIG. 6, the multilayer film is constructed of alternating layers of Co/Pd. However, other pairs of materials such as Co/Pt, Co/Ni, CoFeB/MgO, etc, and single layer alloys of FePt, FePd, CoPt, CoPd, and amorphous rare-earth alloys, such as GdFeCo, TbFeCo, etc., can also be used to form the film with perpendicular magnetic anisotropy (PMA).

Figure 2:
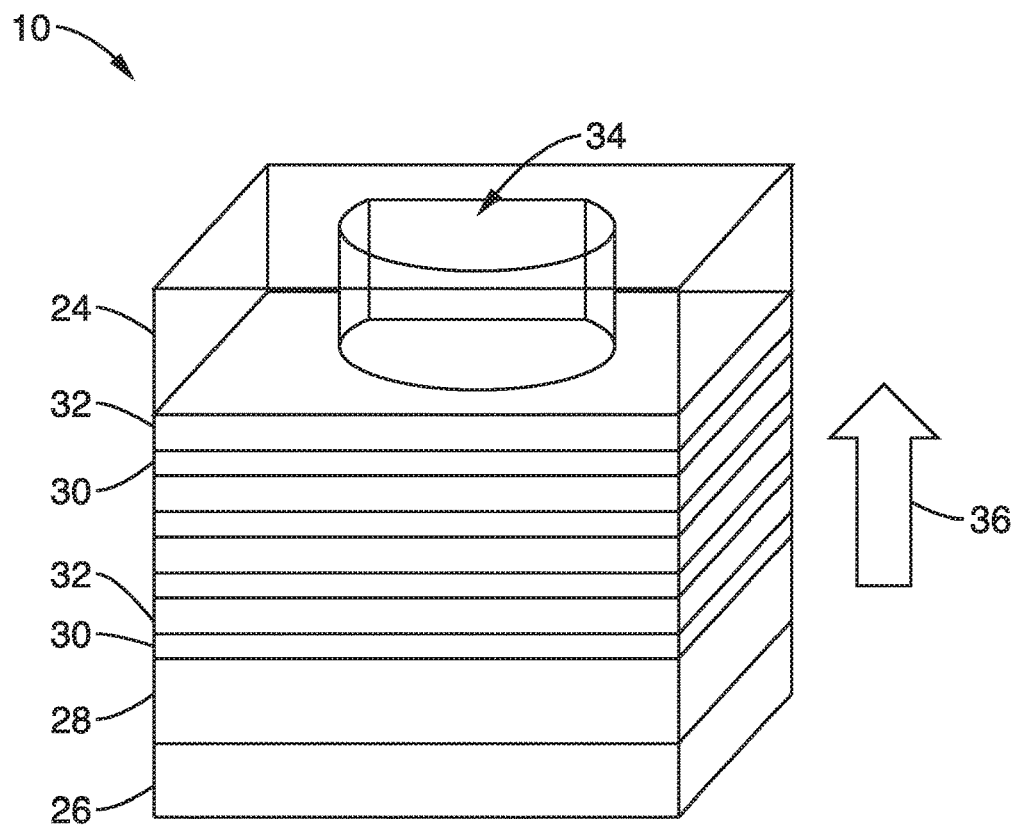
FIG. 2 is a perspective cross-sectional view of one embodiment of an intermediate skyrmion lattice structure following the fabrication method of FIG. 1. Asymmetric edge-cut holes are patterned into a polymer film disposed on top of a Co/Pd multilayer film with perpendicular magnetic anisotropy.

A layer of polymer or other material that can be etched is applied to the multilayer metal layer at block 14 of FIG. 1. As illustrated in the embodiment of FIG. 2, the polymer layer 24 has been applied to a starting structure of a silicon substrate 26, base buffer layer 28 and multiple repeats of alternating layers of the first layer 30 and second metal 32. The polymer layer 24 is applied to a top surface of layer 32 of the multiple layers that collectively form an underlayer that has PMA 36, supported by the silicon base 26.

The polymer layer 24 applied on the top surface of the structure is preferably a polymer such as polymethyl methacrylate (PMMA) or similar resist material that is suitable for e-beam lithography. Although e-beam lithography is preferred, the patterning at block 16 of FIG. 1 can also be conducted with a photolithography process and the application of a photolithography resist rather than an e-beam resist as the template layer at block 14. For example, other suitable materials for the top template layer 24 include EBR-9, ZEP, UV-5, ultra-i, SPR, the Hoechst AZ series, Shipley series, KMPR series, etc.

Figure 3:
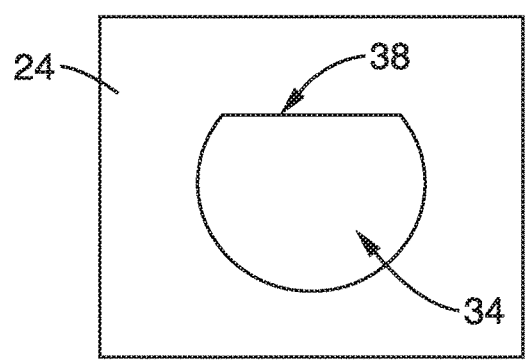
FIG. 3 is a top plan view of an example of a single asymmetric edge-cut hole in polymer layer. The edge-cut acts to control the circularity in the eventual structure.

At block 16 of FIG. 1, the polymer layer is patterned with asymmetrically shaped holes to expose the upper layer of the multilayer film. As shown in FIG. 2 and FIG. 3, the polymer template layer 24 is patterned to produce a hole or opening 34 in the layer exposing the underlying multilayer film. For example, electron beam lithography can be used to create a pattern of asymmetric edge-cut holes 34 (FIG. 3) into a PMMA film on top of a Co/Pd multilayer film with strong perpendicular magnetic anisotropy 36 (FIG. 2). FIG. 3 shows an asymmetrical shape in the form of a circle with an edge cut 38. The edge-cut 38 acts to control the circularity in the eventual structure. Although asymmetric shape shown in the top view of FIG. 3 has an edge-cut cross-section, other shapes can also be patterned in the polymer template layer 24. For example, many different nanostructures where the symmetry is broken by the geometry such as a triangle, a pentagon and a heptagon can be used.

Figure 4:
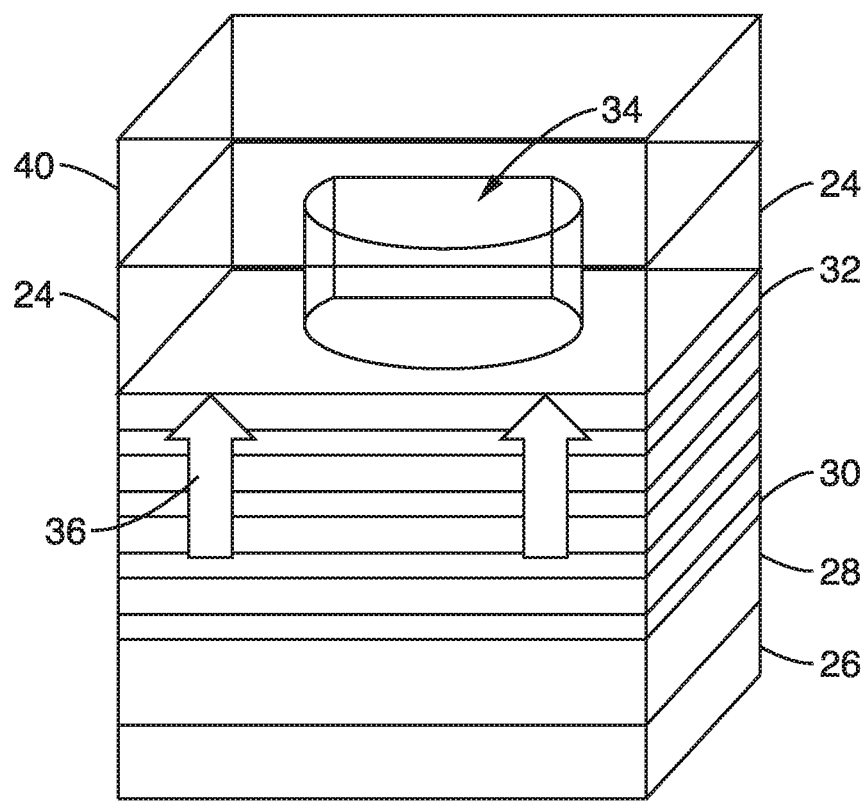
FIG. 4 is a perspective cross-sectional view of one embodiment of an intermediate skyrmion lattice structure following the fabrication method of FIG. 1. The intermediate sample is exposed to an ion bombardment through the etched polymer. The exposed regions develop an in-plane anisotropy, while the protected regions retain their perpendicular anisotropy.

The patterned polymer layer 24 and exposed regions of metal layers is then irradiated with ions at block 18 of FIG. 1. As shown in FIG. 4, in one embodiment, the sample is exposed to 1 keV $Ar^+$ ion bombardment 40. The exposed regions of the underlayer develop an in-plane anisotropy, while the regions protected from bombardment by the polymer layer 24 retain their perpendicular anisotropy 36. In the illustration of FIG. 4, the areas of the multilayer structure 32 that have been irradiated with energetic $Ar^+$ ions 40 through the holes 34 of the patterned polymer layer 24 are modified, tilting their easy axis in-plane. Although $Ar^+$ ions are used to irradiate the patterned metal underlayer, essentially any ion could be used for this exposure. For example, Helium and Gallium ions can be used accounting for differences in the requirements for incident energy and exposure. In addition, the ion bombardment can use ions with a wide range of energies from a minimum of about 1 keV to about 40 keV to produce the desired effects.

At block 20 of FIG. 1, metal microdots or nanodots or other structures are preferably formed using the patterned polymer top layer as a template. For example, a metal such as Co can be sputtered over the irradiated anti-dot arrays, forming edge-cut Co dots after a conventional lift-off process. Although Co is used in this illustration to construct the structures, essentially any magnetic material could be used, including ferromagnetic metals (Fe, Ni, Gd, Sm, Tb, Nd, Mn and their alloys), intermetallic materials (FeGa, NdFeB, etc.), ferromagnetic oxides ($LaSrMnO_3$, $LaSrCoO_3$, etc.), and ferromagnetic nitrides (FeN, GdN, etc.)

Figure 5:
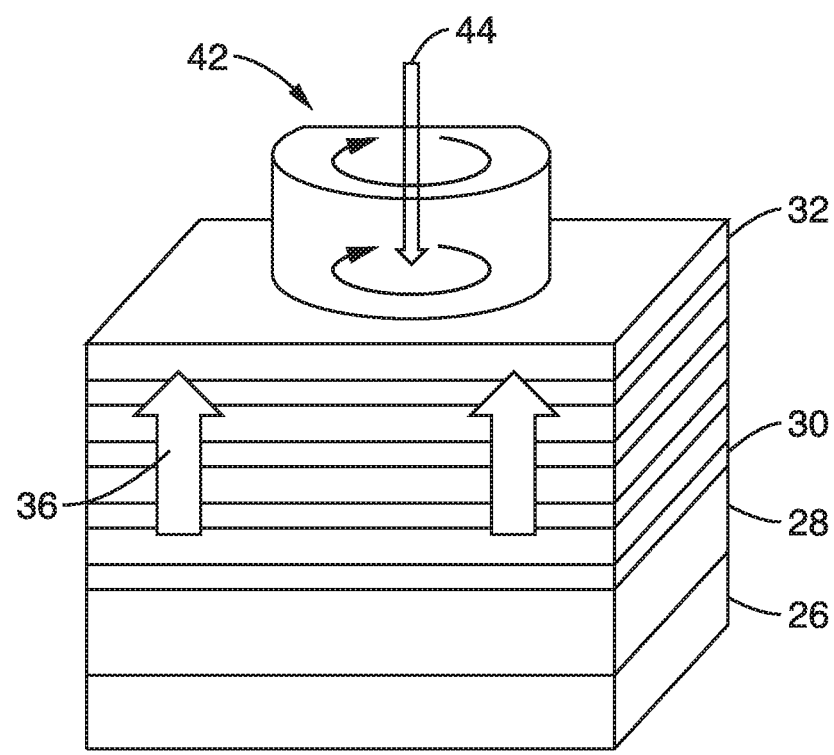
FIG. 5 is a perspective cross-sectional view of one embodiment of an intermediate skyrmion lattice structure following the fabrication method of FIG. 1. The skyrmion state is produced by saturating the under layer in the positive out-of-plane (+OOP) direction, then applying a small negative out-of-plane (−OOP) field. Then an in-plane (IP) field is applied parallel to the asymmetric edge. As the fields are removed the dots will nucleate a magnetic vortex with a controlled circularity and a core in the −OOP direction, which are then imprinted into the underlayer.
Figure 6:
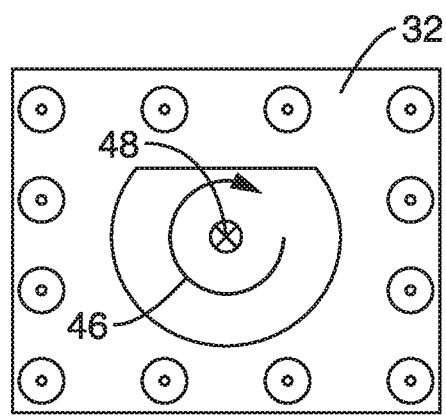
FIG. 6 is a top plan view of an asymmetric dot structure with controlled circularity according to one embodiment of the technology, with the vortex core pointing into the paper (cross). This spin texture is imprinted into the layer underneath the asymmetric dot, which together with the unirradiated region whose magnetic moments are pointing out of the paper (dots), forms the skyrmion state.

Finally, at block 22 of FIG. 1, the skyrmion state is set with a series of magnetic field sequences. Referring also to FIG. 5 and FIG. 6, the skyrmion state can be prepared by saturating the under layer in the positive out of plane (+OOP) field, parallel to PMA 36, and then applying a small (−OOP) field 44. Then an in plane (IP) field is applied parallel to the asymmetric edge. As the fields are removed the dot structures 42 will nucleate a magnetic vortex with a controlled chirality 46 and a core 48 in the −OOP direction to set the state as shown in FIG. 6.

In one preferred embodiment of the method, the top layer of Co/Pd is coated with a polymer coating or similar material that is suitable for use as lithography resist at block 14. Using electron-beam lithography, hexagonal arrays of edge-cut asymmetric holes (with diameter of 560 nm and center-to-center spacing of 1 μm) are patterned into the polymer layer at block 16. Ion irradiation of the exposed metal underlayer (Co/Pd) of the patterned and etched polymer layer causes the regions to develop an in-plane anisotropy while the protected regions retain the perpendicular anisotropy at block 18. Then, using lift-off, Co microdots are deposited on the top surface of the underlayer at block 20. The ion irradiation, which suppresses PMA in the underlayer, allows imprinting of the vortex structure from the nanodots into the Co/Pd to form skyrmion lattices.

The skyrmion state is then prepared at block 22 using a specific magnetic field sequence. First, the Co/Pd underlayer is saturated in an out-of-plane direction, defined as positive. Then, a static field is applied in the negative out-of-plane direction, which is much weaker than the reversal field of the underlayer and the Co/Pd remained positively saturated. A moderate in-plane field is then applied parallel to the flat edge of the asymmetric Co dots, driving them to a saturated state. Removing this field facilitated the nucleation of a vortex in each of the dots with a well-defined circularity; the static perpendicular field biased the vortex core polarity at the nucleation event to be opposite to the Co/Pd underlayer, completing the setting of the skyrmion state.

In an alternative embodiment, the multilayer metal underlayer is first saturated in the positive perpendicular direction. Then the perpendicular field is removed and a much smaller in-plane field is applied to saturate the Co dots parallel to their flat edge. Next, a small negative perpendicular field is applied as the in-plane field is removed to set the polarity and finally the perpendicular field is removed.

Although fabrication of a single skyrmion is used to illustrate the methods for simplicity, skyrmion lattices over extended areas in their ground state at room temperature can be designed and fabricated in the same fashion. The patterning of asymmetric magnetic nanodots with controlled circularity on an underlayer with PMA can be easily scaled. Polarity can be controlled by a tailored magnetic field sequence and the vortex structure is imprinted from the dots into the interfacial region of the underlayer via suppression of the PMA by the ion-irradiation step.

In the hybrid structure shown in FIG. 2 through FIG. 6, the asymmetric Co dots are used to imprint the vortex structure into the Co/Pd to form the skyrmion state. At the same time, they also anchor the skyrmions onto the artificial lattice. In an alternative embodiment, a new type of embedded skyrmion structure is illustrated that is designed to mobilize skyrmions.

Figure 7:
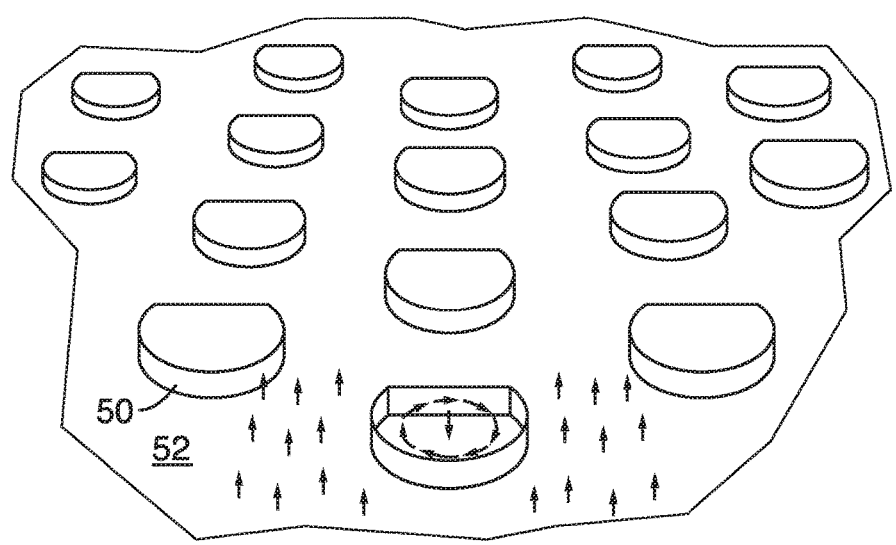
FIG. 7 is a schematic diagram of an embedded "dotless" skyrmion lattice design that eliminates the Co dots on top of Co/Pd. Here the in-plane vortex state is directly realized in the irradiated Co/Pd regions. The unirradiated regions are magnetized opposite to the vortex core in the irradiated dots.

As illustrated schematically in FIG. 7, the in-plane vortices 50 are embedded in the Co/Pd layer 52, without any physical protrusions in this embodiment. This design is particularly advantageous for exploration of skyrmion dynamic properties and spin-transport phenomena. Sample fabrication utilizes only the initial steps of the aforementioned sequence, without the need for placing Co dots on top of the Co/Pd film. By tuning the ion irradiation energy and fluence, the perpendicular magnetic anisotropy of the exposed Co/Pd (in the shape of asymmetric dots) will be completely suppressed and the magnetic easy axis will be turned in-plane. By adjusting the aspect ratio (i.e. the diameter of each dot vs. depth of irradiation) of the exposed Co/Pd region, in-plane vortices 50 will be realized, surrounded by the unexposed Co/Pd 52 which still has perpendicular magnetic anisotropy indicated by arrows in FIG. 7. The polarity of the imbedded vortices will be set opposite to the unexposed Co/Pd matrix to achieve the skyrmion state, following a similar approach as described for the hybrid structure.

It can be seen that alternative configurations to the asymmetric skyrmion structures can be devised to produce a variety of devices. For example, memory or logic devices can be designed using magnetic skyrmions as bits to store information, where the state of the bit is encoded by the presence or absence of the magnetic skyrmion.

Building upon these dots or embedded skyrmions, skyrmion "race-tracks" may be designed to investigate pumping and manipulation of mobile skyrmions, for example, where each skyrmion is pumped from the asymmetric disc into an elongated track.

Figure 8:
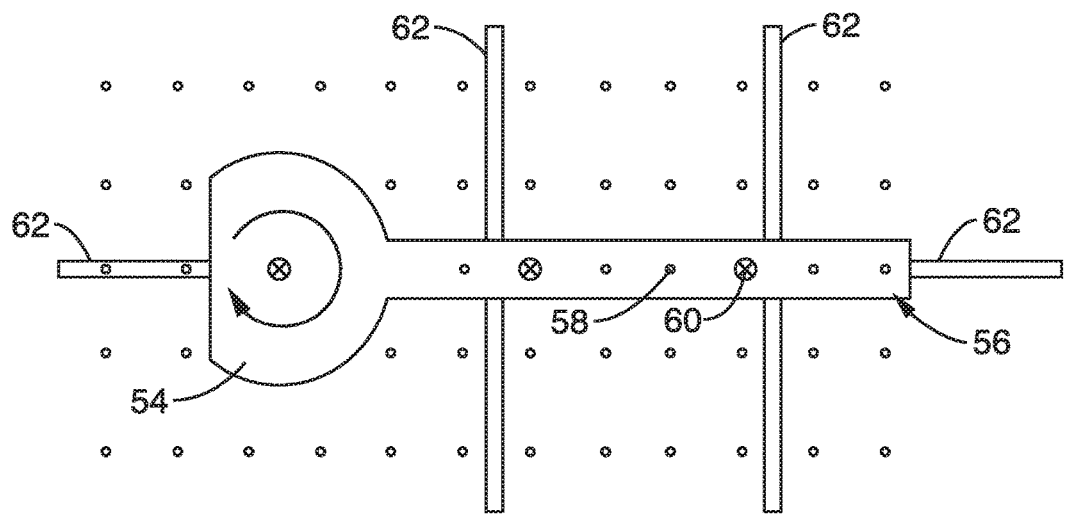
FIG. 8 is a schematic top-view of a skyrmion "race-track" architecture where each skyrmion is pumped from the asymmetric disc on the left end into the long track. The dots and crosses indicate magnetic moments pointing out of and into the paper, respectively.

As illustrated in the top view of FIG. 8, the structure utilizes the same Co/Pd film with PMA. The asymmetric edge-cut disc section 54 includes a track portion 56 in the form of an elongated arm extending radially from the asymmetric disc 54. The collective architecture will be ion-irradiated to turn its magnetic easy axis towards the in-plane direction. The dots 58 and crosses 60 indicate magnetic moments pointing out of and into the paper, respectively.

The skyrmion is introduced from the asymmetric disc 54 on the left side of the track 56, through a magnetic field sequence similar to that mentioned earlier to define the skyrmion. Then the skyrmion will be driven by magnetic fields or current to the long and narrow track 56. Contact pads 62 are added to allow the introduction of partially spin-polarized current to drive the skyrmions along the track 56, to probe the topological Hall Effect and other spin transport properties, and to explore their applications for magnetic memory, logic and other spintronic devices.

The invention may be better understood with reference to the accompanying examples, which are intended for purposes of illustration only and should not be construed as in any sense limiting the scope of the present invention as defined in the claims appended hereto.

Example 1

In order to prove the concept of the device and the fabrication methods, a skyrmion lattice device was produced using the methods of the present technology as outlined in FIG. 1 through FIG. 6 and tested. Sample lattices were prepared by a three-step process. In step one, PMA thin films with a nominal structure of [Co (0.5 nm)/Pd (1 nm)]$_{10}$ were grown on naturally oxidized Si substrates with a Pd seed layer by DC magnetron sputtering in a 0.67-Pa Ar atmosphere (base pressure approximately 1.2×10$^{-6}$ Pa). In the second step, following a standard e-beam lithography procedure, hexagonal arrays of edge-cut asymmetric holes with diameter of 560 nm and center-to-center spacing of 1 µm were patterned into an approximately 400-nm thick PMMA polymer layer, which had been spin-coated onto the Co/Pd film. After development, the exposed Co/Pd was irradiated by 1 keV Ar$^+$ plasma (with a fluence of 200 mA cm$^{-2}$) for 3 seconds. Using a Stopping Range In Matter (SRIM) simulation platform, calculations suggested damage to the multilayer structure up to a 4 nm depth and the PMMA sufficiently protected the undeveloped regions.

During the third step, 32 nm thick asymmetric Co dots were grown over the irradiated regions following a standard lift-off procedure. The entire patterned area was 1 cm$^2$. Layer thicknesses were confirmed from witness samples made at the same time and measured by X-ray reflectivity; lateral dimensions were confirmed by scanning electron microscopy.

Once the samples were fabricated, an appropriate magnetic field sequence was applied at room temperature to prepare the skyrmion state. First, the Co/Pd underlayer was saturated in the positive OOP direction ($\mu_0 H_{OOP}$=1.5 T). Then, a static field was applied in the negative OOP direction ($\mu_0 H_{OOP}$=−100 mT), which was much weaker than the reversal field of the underlayer and the Co/Pd remained positively saturated. A moderate in-plane field was then applied parallel to the flat edge of the asymmetric Co dots, driving them to a saturated state ($\mu_0 H_{OOP}$=−100 mT, $\mu_0 H_{IP}$=100 mT). Removing this field facilitated the nucleation of a vortex in each of the dots with a well-defined circularity i.e. the static perpendicular field biased the vortex core polarity at the nucleation event to be opposite to the Co/Pd underlayer. By irradiating the Co/Pd region underneath the Co vortex dots, the competition between the under layer's PMA and the dot's magnetostatic energy was circumvented, allowing imprinting of the vortex structure and ensuring that the underlayer orientation would not influence the core polarity. For comparison, a vortex lattice (VL) was formed by applying the static perpendicular field parallel to the underlayer. Finally, a mixed lattice (ML) was prepared in the absence of a guide field and was expected to have a random polarity distribution.

After conditioning the system into the Skyrmion state long-range chiral ordering of the dots was confirmed directly with a variety of magnetically sensitive microscopy techniques. For example, conditioning the system with an in-plane field to the right, the resultant dots have a counter-clockwise circularity. After the artificial skyrmions are set by the aforementioned magnetic field sequence, they were observed to be stable over wide magnetic field and temperature (persist to near the Co/Pd Curie temperature) ranges.

To further verify the functionality of the lattices, simulations of the irradiation penetration were performed using a SRIM simulation platform modeling 1 keV $Ar^+$ normally incident on a film with the same structure as the experimental underlayer. The results suggest that irradiation damages the top three bilayers, corresponding to approximately 4 nm. Micromagnetic simulations were used to model the magnetic structure of the hybrid structure. Simulations were performed using the bulk values for the saturation magnetization ($M_S$ (Co)=1.4×10$^6$ A m$^{-3}$, $M_S$ (unirradiated Co/Pd, irradiated CoPd)=3.02×10$^5$ A m$^{-3}$), magneto-crystalline anisotropy ($K_U$ (Co, irradiated CoPd)=0 J m$^{-3}$, $K_U$ (unirradiated Co/Pd)=8×10$^5$ J m$^{-3}$) and exchange stiffness (A (Co)=3.0×10$^{-11}$ J m$^{-1}$, A (unirradiated Co/Pd and irradiated CoPd)=5×10$^{-12}$ J m$^{-1}$) with a rectangular mesh of 4×4×2 nm.

The irradiated region was treated as an embedded uniform cylinder located under the dot with a thickness of 4 nm, consistent with the SRIM simulations and PNR results, and having the same saturation magnetization and exchange stiffness as the unirradiated underlayer, but with $K_U$=0. Simulations showed that with the polarity setting field, the chiral structure and core structure are imprinted into the underlayer. However, without the conditioning field, the hybrid structure was not in the skyrmion state.

Example 2

To further demonstrate the technology, the hybrid structures of asymmetric Co nanodot arrays with in-plane magnetic easy axis grown on Co/Pd thin film underlayers with PMA fabricated in Example 1 were tested.

Hysteresis loops for a Co/Pd thin-film reference sample before and after $Ar^+$ irradiation, and those for the hybrid sample were recorded. The as-grown Co/Pd films exhibited strong PMA with an OOP remanence of essentially unity and a coercivity of $\mu_0 H_C$=320 mT. In contrast, for the Co/Pd film irradiated by $Ar^+$ over the entire area, the in-plane and perpendicular hysteresis loops are nearly identical, confirming that the PMA had been successfully suppressed.

The hybrid sample in the perpendicular geometry retains the characteristics of the unirradiated Co/Pd film, illustrating that the processing did not damage the perpendicular layer other than as designed. With the in-plane geometry, the loop exhibited a pinched shape, typical of magnetic vortex reversal, with nucleation and annihilation fields of approximately 10 mT and 60 mT, respectively. These results demonstrated that indeed the hybrid sample had realized the designed magnetic configurations, that is, the Co/Pd underlayer was perpendicularly magnetized in a single domain state, while the Co dots are in an in-plane vortex state.

Example 3

To confirm the functionality of the fabricated skyrmion lattices (SL), circularity control and polarity control in the vortex region (Co dots) were evaluated. Circularity control of the hybrid sample was illustrated in First-Order Reversal Curves (FORCs) measured in the in-plane geometry where the applied field is parallel to the flat edge of the dots. Specifically, FORCs approaching positive saturation revealed essentially two discrete vortex annihilation fields depending on their reversal fields. FORCs reversing near the negative saturation conform onto the major loop, delineated by the outer boundaries of the family of FORCs. In contrast, those reversing sooner, particularly with reversal fields in the first quadrant, revealed a smaller vortex annihilation field. These discrete annihilation fields are manifestations of circularity controlled vortices being annihilated from the flat versus rounded edge of the dots.

Remanent-state magnetic imaging performed with magnetic force microscopy (MFM) and scanning electron microscopy with polarization analysis (SEMPA), conducted after the SL-setting field sequence, provided direct evidence of circularity control over the dot arrays. This was further confirmed by magnetic transmission X-ray microscopy (MTXM) study of similar samples.

Confirmation of polarity control was facilitated by the large sample area (1 cm$^2$) that allowed the magnetometry signatures of the skyrmion lattices to be distinguished. The SL was prepared with the core polarity opposite to the underlayer magnetization by applying a perpendicular bias field as the vortex was nucleated. Similarly, by applying a perpendicular bias parallel to the underlayer magnetization instead, the polarity could be aligned with the underlayer. The resultant structure is not an SL, since the phase shift of the perpendicular magnetization across this structure will be 0, representing just a vortex lattice (VL) on top of a PMA underlayer (skyrmion number Q=0 in Co/Pd). The SL and VL were shown to have different perpendicular remanent magnetizations as a result of the vortex core orientation. In addition, the bias field can be removed entirely during the vortex nucleation in the Co dots, resulting in a random distribution of the core polarity. This mixed lattice (ML) is expected to have a remanence between the cases with ordered polarity, and a reversal behavior indicative of both features.

Remanent state of the hybrid structure was also configured into the SL, VL and ML, lattices respectively as described in Example 1. As the perpendicular field was swept from 0 to negative saturation, the magnetization curves revealed clear differences, (1 μemu=1 nA m$^2$), with apparent differences between SL and VL lattices. In the early stage of the magnetization reversal, the case of parallel alignment between the core and underlayer (VL) exhibited the largest magnetization, while the anti-parallel alignment (SL) showed the smallest, with random alignment (ML) seen midway in between the VL and SL curves. The magnetization differences between the VL and SL configurations divided by the number of dots corresponded to a region with perpendicular moment of an approximately 30 nm radius within each dot. This value is an upper limit of the core size, since the surrounding region of the core and imprinted skyrmions also contribute to the signal. This difference remained almost constant along the field sweep until the underlayer's reversal field at about −0.3 T, indicating the stability of the skyrmions. As the Co/Pd underlayer starts its reversal, an abrupt magnetization drop occurs first in the SL configuration and last in the VL configuration. This difference arises because in the SL the oppositely oriented cores will facilitate the nucleation of reversal domains, whereas in the VL the parallel cores will not. The difference in the nucleation field for SL versus VL is indicative of the topological effect on the nucleation process of Co/Pd reversal domains. The ML configuration showed a mixed reversal, evolving from tracking the VL to the SL. This behavior was consistent with the presence of both types of pole configurations with opposite polarities. The magnetization difference near remanence and the field sweep thus clearly demonstrates the polarity control.

Example 4

To further demonstrate the functionality of the skyrmion lattices (SL), the imprinting of the vortex structure from the dot into the underlayer was evaluated. Polarized neutron reflectometry (PNR) was used to confirm that the chiral texture in the vortex-state Co dots is imprinted into the Co/Pd underlayer, as PNR is sensitive to structural and magnetic depth profiles of thin films and multilayers. The hybrid structure was first prepared into the SL state at remanence. By using a position-sensitive area detector, both specular and off-specular scattering (unpolarized) were first captured.

PNR measurements were then performed with a perpendicular guide field of 6 mT, placing in-plane magnetic contrast in the spin-flip channel and nuclear contrast in the non-spin-flip channel. The specular reflectivity showed clear oscillations in both the spin-flip and non-spin-flip channels. Fitted nuclear and magnetic depth profiles ($\chi^2$=0.70) and scattering were calculated. The nuclear depth profile matched the designed structure very well. Depth profile of the in-plane magnetization captured not only the entire thickness of the Co dot but also extended into the Co/Pd underlayer by 3 nm, indicating an imprinted interfacial layer. The thickness of the imprinted layer was consistent with thickness of the ion-irradiated region estimated from prior simulations. It is this layer that separates the singularities at the top and bottom interfaces and provides the topological protection of the skyrmions, as shown by magnetization measurements.

The PNR-measured in-plane moment in the interfacial layer is slightly larger than that of the Co dot, likely resulting from the local lateral exchange coupling of the irradiated Co/Pd region to the surrounding unirradiated Co/Pd. Since specular PNR is insensitive to perpendicular magnetization, no net in-plane magnetization is detected from PNR underneath the imprinted interfacial layer or in Co/Pd regions between the irradiated dots, consistent with the PMA in unirradiated Co/Pd.

The neutron scattering clearly demonstrated that artificial skyrmions are indeed imprinted by the vortex-state Co dot into the Co/Pd underlayer. For samples without the irradiated underlayers, it is likely that the imprinting does not extend as far or is absent altogether. The smooth variation of the magnetization through the interface between the dot and underlayer reveals that the imprinted structures reflect the chiral structure from the vortex dots, which have been shown to have chiral and polar ordering. Traversing across the centre of each Co/Pd dot structure at the imprinted interface constitutes a 360° rotation of the spin orientation, corresponding to a skyrmion number of Q=1. The imprinted chiral structure over the entire sample is indeed a Bloch SL.

Magnetoresistance of the skyrmion lattices was also evaluated. It had been shown previously that, due to their complex spin configurations, magneto-transport behavior in skyrmion materials presents particular opportunities. Perpendicular and transverse anisotropic magnetoresistance (AMR) magneto-transport measurements were obtained and evaluated. Magnetometry was measured using a vibrating sample magnetometer in both the perpendicular and in-plane geometries. In the in-plane case the field was applied parallel to the flat edge of the dots.

The perpendicular AMR demonstrated an expected magnetic field dependence, with the AMR peak positions coinciding with the coercive fields of the Co/Pd underlayer perpendicular loop and $R(\theta)=R_T \Delta R \cos^2 \theta$, where resistance R depends on the angle $\theta$ between the applied field and current direction, and $R_T$ is the resistance when $\theta$=90°. The signal is small because much of the current is shunted through the Pd seed layer.

With the field applied in-plane but perpendicular to the current, the transverse AMR demonstrated a sensitivity to the vortex nucleation and annihilation events. At large fields, the dots are in the single domain configuration, with their moment perpendicular to the current path. On nucleation the vortex forms a flux-closure structure, which can be approximated as four orthogonally configured magnetic regions, thus roughly half of the vortex remains perpendicular to the current and half becomes parallel, and the latter contributes to a larger resistance $R_{//}=R_T+\Delta R$ as $\theta$=0. The transverse AMR peak positions coincide with the coercivities of the in-plane loop of the Co dots where the parallel components are at the maximum. The discrete nature of the Co dots suggests that the AMR signal should come from spin textures in the Co/Pd underlayer. The correlation between the transverse AMR and the in-plane vortex structure of the Co dots indicates a strong coupling between the dots and the underlayer, which was further evidence of the imprinting of the skyrmion lattice.

From the description herein, it will be appreciated that that the present disclosure encompasses multiple embodiments which include, but are not limited to, the following:

1. A method for fabricating artificial skyrmions and skyrmion lattices with a stable ground state at room temperature, the method comprising: (a) providing a substrate with an underlayer with perpendicular magnetic anisotropy (PMA); (b) applying a template layer to a top surface of the underlayer; (c) patterning the template layer with one or more asymmetrically shaped openings exposing the underlayer; (d) irradiating the exposed underlayer with ions; (e) forming asymmetrically shaped structures on the irradiated underlayer; (f) removing the template layer; and (g) setting the skyrmion state.

2. The method of any preceding embodiment, further comprising coupling the substrate to a silicon support base.

3. The method of any preceding embodiment, wherein the skyrmion state is set by performing steps comprising: (a) saturating the underlayer in a positive out-of-plane (+OOP) direction; (b) applying a static field in a negative out-of-plane (−OOP) direction that is weaker than a reversal field of the underlayer so that the underlayer remains positively saturated; (c) applying a moderate in plane (IP) field parallel to a flat edge of the asymmetric structures, driving them to a saturated state; (d) wherein removing the IP field facilitates the nucleation of a vortex in each of the asymmetric structures with a well-defined circularity; and (e) wherein the static out-of-plane field biases the vortex core polarity at the nucleation event to be opposite to the underlayer, defining the polarity.

4. The method of any preceding embodiment, wherein the substrate underlayer with perpendicular magnetic anisotropy comprises alternating layers of cobalt and palladium.

5. The method of any preceding embodiment, wherein the substrate underlayer comprises alternating layers of materials selected from the group of materials consisting of Co/Pt, Co/Ni, and CoFeB/MgO.

6. The method of any preceding embodiment, wherein the substrate underlayer is a material selected from the group of materials consisting of FePt, FePd, CoPt, CoPd, GdFeCo, and TbFeCo.

7. The method of any preceding embodiment, wherein the template layer comprises a polymer layer configured for e-beam lithography.

8. The method of any preceding embodiment, wherein the template layer comprises a photoresist layer configured for photolithography.

9. The method of any preceding embodiment, wherein the asymmetrically shaped structures are formed from a ferromagnetic metal material selected from the group of materials consisting of Fe, Ni, Gd, Sm, Tb, Nd, Mn and their alloys.

10. The method of any preceding embodiment, wherein the asymmetrically shaped structures are formed from an intermetallic material selected from the group of materials consisting of FeGa and NdFeB.

11. The method of any preceding embodiment, wherein the asymmetrically shaped structures are formed from a ferromagnetic oxide material selected from the group of materials consisting of $LaSrMnO_3$ and $LaSrCoO_3$.

12. The method of any preceding embodiment, wherein the asymmetrically shaped structures are formed from a ferromagnetic nitride material selected from the group of materials consisting of FeN and GdN.

13. The method of any preceding embodiment, wherein the asymmetric structure has a cross-sectional shape selected from the group of shapes consisting of an edge cut circle, a triangle, a pentagon and a heptagon.

14. The method of any preceding embodiment, wherein the asymmetric structure comprises an asymmetric edge-cut circle with an arm extending radially from the center of the edge-cut circle.

15. The method of any preceding embodiment, further comprising: applying at least one contact pad to the arm of the asymmetric structure configured to allow the introduction of partially spin-polarized current to drive the skyrmions along the length of the arm.

16. A method for fabricating artificial skyrmions and skyrmion lattices with a stable ground state at room temperature, the method comprising: (a) providing a substrate with a support base and an active layer with perpendicular magnetic anisotropy (PMA); (b) irradiating parts of the active layer with ions; (c) embedding one or more asymmetrically shaped structures into irradiated parts of a top surface of the active layer; and (d) setting the skyrmion state.

17. The method of any preceding embodiment, wherein the skyrmion state is set by performing steps comprising: (a) saturating the active layer in a positive out-of-plane (+OOP) direction; (b) applying a static field in a negative out of plane (−OOP) direction that is weaker than a reversal field of the active layer so that the active layer remains positively saturated; (c) applying a moderate in plane (IP) field parallel to a flat edge of the asymmetric structures, driving them to a saturated state; (d) wherein removing the IP field facilitates the nucleation of a vortex in each of the asymmetric structures with a well-defined circularity; and (e) wherein the static out-of-plane field biases the vortex core polarity at the nucleation event to be opposite to the active layer thereby defining the polarity.

18. The method of any preceding embodiment, wherein the active layer comprises alternating layers of materials selected from the group of materials consisting of Co/Pd, Co/Pt, Co/Ni, and CoFeB/MgO.

19. The method of any preceding embodiment, wherein the substrate underlayer is a material selected from the group of materials consisting of FePt, FePd, CoPt, CoPd, GdFeCo, and TbFeCo.

20. The method of any preceding embodiment, wherein the embedded asymmetric structure has a cross-sectional shape selected from the group of shapes consisting of an edge cut circle, a triangle, a pentagon and a heptagon.

21. A method for fabricating artificial skyrmions and skyrmion lattices with a stable ground state at room temperature, the method comprising: (a) providing a substrate with a support base and an underlayer with perpendicular magnetic anisotropy (PMA); (b) applying a template layer to a top surface of the underlayer; (c) patterning the template layer with one or more asymmetrically shaped openings exposing the underlayer; (d) irradiating the exposed underlayer with ions; (e) forming asymmetrically shaped structures on the irradiated underlayer, the asymmetric structure comprising an asymmetric edge-cut circle with an arm extending radially from the center of the edge-cut circle; (f) removing the template layer; (g) applying at least one contact pad to the arm of the asymmetric structure configured to allow the introduction of partially spin-polarized current to drive the skyrmions along the length of the arm; and (h) setting the skyrmion state.

22. The method of any preceding embodiment, wherein the skyrmion state is set by performing steps comprising: (a) saturating the active layer in a positive out-of-plane (+OOP) direction; (b) applying a static field in a negative out of plane (−OOP) direction that is weaker than a reversal field of the active layer so that the active layer remains positively saturated; (c) applying a moderate in plane (IP) field parallel to a flat edge of the asymmetric structures, driving them to a saturated state; (d) wherein removing the IP field facilitates the nucleation of a vortex in each of the asymmetric structures with a well-defined circularity; and (e) wherein the static out of plane field biases the vortex core polarity at the nucleation event to be opposite to the active layer thereby defining the polarity.

23. The method of any preceding embodiment, wherein the active layer comprises of materials selected from the group of materials consisting of Co/Pd, Co/Pt, Co/Ni, CoFeB/MgO, FePt, FePd, CoPt, CoPd, GdFeCo, and TbFeCo.

24. The method of any preceding embodiment, wherein the template layer comprises a polymethyl methacrylate (PMMA) polymer layer configured for e-beam lithography.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method for fabricating artificial skyrmions and skyrmion lattices with a stable ground state at room temperature, the method comprising:
   (a) providing a substrate with an underlayer with perpendicular magnetic anisotropy (PMA);
   (b) applying a template layer to a top surface of the underlayer;
   (c) patterning the template layer with one or more asymmetrically shaped openings exposing the underlayer;
   (d) irradiating the exposed underlayer with ions;
   (e) forming asymmetrically shaped structures on the irradiated underlayer;
   (f) removing the template layer; and
   (g) setting the skyrmion state.

2. The method of claim 1, further comprising coupling the substrate to a silicon support base.

3. The method of claim 1, wherein the skyrmion state is set by performing steps comprising:
   (a) saturating the underlayer in a positive out-of-plane (+OOP) direction;
   (b) applying a static field in a negative out-of-plane (−OOP) direction that is weaker than a reversal field of the underlayer so that the underlayer remains positively saturated;
   (c) applying a moderate in plane (IP) field parallel to a flat edge of the asymmetric structures, driving them to a saturated state;
   (d) wherein removing the IP field facilitates the nucleation of a vortex in each of the asymmetric structures with a well-defined circularity; and
   (e) wherein the static out-of-plane field biases the vortex core polarity at the nucleation event to be opposite to the underlayer, defining the polarity.

4. The method of claim 1, wherein said substrate underlayer with perpendicular magnetic anisotropy comprises alternating layers of cobalt and palladium.

5. The method of claim 1, wherein said substrate underlayer comprises alternating layers of materials selected from the group of materials consisting of Co/Pt, Co/Ni, and CoFeB/MgO.

6. The method of claim 1, wherein said substrate underlayer is a material selected from the group of materials consisting of FePt, FePd, CoPt, CoPd, GdFeCo, and TbFeCo.

7. The method of claim 1, wherein said template layer comprises a polymer layer configured for e-beam lithography.

8. The method of claim 1, wherein said template layer comprises a photoresist layer configured for photolithography.

9. The method of claim 1, wherein the asymmetrically shaped structures are formed from a ferromagnetic metal material selected from the group of materials consisting of Fe, Ni, Gd, Sm, Tb, Nd, Mn and their alloys.

10. The method of claim 1, wherein the asymmetrically shaped structures are formed from an intermetallic material selected from the group of materials consisting of FeGa and NdFeB.

11. The method of claim 1, wherein the asymmetrically shaped structures are formed from a ferromagnetic oxide material selected from the group of materials consisting of $LaSrMnO_3$ and $LaSrCoO_3$.

12. The method of claim 1, wherein the asymmetrically shaped structures are formed from a ferromagnetic nitride material selected from the group of materials consisting of FeN and GdN.

13. The method of claim 1, wherein said asymmetric structure has a cross-sectional shape selected from the group of shapes consisting of an edge cut circle, a triangle, a pentagon and a heptagon.

14. The method of claim 1, wherein said asymmetric structure comprises an asymmetric edge-cut circle with an arm extending radially from the center of the edge-cut circle.

15. The method of claim 14, further comprising:
   applying at least one contact pad to the arm of the asymmetric structure configured to allow the introduction of partially spin-polarized current to drive the skyrmions along the length of the arm.

16. A method for fabricating artificial skyrmions and skyrmion lattices with a stable ground state at room temperature, the method comprising:
   (a) providing a substrate with a support base and an active layer with perpendicular magnetic anisotropy (PMA);
   (b) irradiating parts of the active layer with ions;
   (c) embedding one or more asymmetrically shaped structures into irradiated parts of a top surface of the active layer; and
   (d) setting the skyrmion state.

17. The method of claim 16, wherein the skyrmion state is set by performing steps comprising:
   (a) saturating the active layer in a positive out-of-plane (+OOP) direction;
   (b) applying a static field in a negative out of plane (−OOP) direction that is weaker than a reversal field of the active layer so that the active layer remains positively saturated;
   (c) applying a moderate in plane (IP) field parallel to a flat edge of the asymmetric structures, driving them to a saturated state;
   (d) wherein removing the IP field facilitates the nucleation of a vortex in each of the asymmetric structures with a well-defined circularity; and
   (e) wherein the static out-of-plane field biases the vortex core polarity at the nucleation event to be opposite to the active layer thereby defining the polarity.

18. The method of claim 16, wherein said active layer comprises alternating layers of materials selected from the group of materials consisting of Co/Pd, Co/Pt, Co/Ni, and CoFeB/MgO.

19. The method of claim 16, wherein said substrate underlayer is a material selected from the group of materials consisting of FePt, FePd, CoPt, CoPd, GdFeCo, and TbFeCo.

20. The method of claim 16, wherein said embedded asymmetric structure has a cross-sectional shape selected from the group of shapes consisting of an edge cut circle, a triangle, a pentagon and a heptagon.

21. A method for fabricating artificial skyrmions and skyrmion lattices with a stable ground state at room temperature, the method comprising:

(a) providing a substrate with a support base and an underlayer with perpendicular magnetic anisotropy (PMA);
(b) applying a template layer to a top surface of the underlayer;
(c) patterning the template layer with one or more asymmetrically shaped openings exposing the underlayer;
(d) irradiating the exposed underlayer with ions;
(e) forming asymmetrically shaped structures on the irradiated underlayer, said asymmetric structure comprising an asymmetric edge-cut circle with an arm extending radially from the center of the edge-cut circle;
(f) removing the template layer;
(g) applying at least one contact pad to the arm of the asymmetric structure configured to allow the introduction of partially spin-polarized current to drive the skyrmions along the length of the arm; and
(h) setting the skyrmion state.

22. The method of claim 21, wherein the skyrmion state is set by performing steps comprising:
(a) saturating the active layer in a positive out-of-plane (+OOP) direction;
(b) applying a static field in a negative out of plane (−OOP) direction that is weaker than a reversal field of the active layer so that the active layer remains positively saturated;
(c) applying a moderate in plane (IP) field parallel to a flat edge of the asymmetric structures, driving them to a saturated state;
(d) wherein removing the IP field facilitates the nucleation of a vortex in each of the asymmetric structures with a well-defined circularity; and
(e) wherein the static out of plane field biases the vortex core polarity at the nucleation event to be opposite to the active layer thereby defining the polarity.

23. The method of claim 17, wherein said active layer comprises of materials selected from the group of materials consisting of Co/Pd, Co/Pt, Co/Ni, CoFeB/MgO, FePt, FePd, CoPt, CoPd, GdFeCo, and TbFeCo.

24. The method of claim 21, wherein said template layer comprises a polymethyl methacrylate (PMMA) polymer layer configured for e-beam lithography.

* * * * *